United States Patent
Yuguchi et al.

(10) Patent No.: US 10,770,439 B2
(45) Date of Patent: Sep. 8, 2020

(54) ELECTRONIC MODULE

(71) Applicant: SHINDENGEN ELECTRIC MANUFACTURING CO., LTD., Tokyo (JP)

(72) Inventors: Junya Yuguchi, Hanno (JP); Kousuke Ikeda, Hanno (JP); Kenichi Suzuki, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 205 days.

(21) Appl. No.: 15/763,925

(22) PCT Filed: Feb. 13, 2017

(86) PCT No.: PCT/JP2017/005147
§ 371 (c)(1),
(2) Date: Mar. 28, 2018

(87) PCT Pub. No.: WO2018/146813
PCT Pub. Date: Aug. 16, 2018

(65) Prior Publication Data
US 2019/0057956 A1  Feb. 21, 2019

(51) Int. Cl.
*H01L 25/16* (2006.01)
*H01L 25/11* (2006.01)
(Continued)

(52) U.S. Cl.
CPC .......... *H01L 25/162* (2013.01); *H01L 23/145* (2013.01); *H01L 23/36* (2013.01);
(Continued)

(58) Field of Classification Search
CPC ... H01L 25/162; H01L 23/552; H01L 23/564; H01L 23/36; H01L 25/072; H01L 25/071;
(Continued)

(56) References Cited

U.S. PATENT DOCUMENTS

| | | | | | |
|---|---|---|---|---|---|
| 5,414,402 | A | * | 5/1995 | Mandai | H01F 17/0013 257/E27.114 |
| 2005/0168961 | A1 | * | 8/2005 | Ono | H01L 23/5385 361/784 |

(Continued)

FOREIGN PATENT DOCUMENTS

| EP | 1553630 A1 | 7/2005 |
|---|---|---|
| JP | 2007005713 A | 1/2007 |

(Continued)

OTHER PUBLICATIONS

From NL 2020394 Netherlands Search Report and Search Opinion, dated Aug. 21, 2018 with machine translation provided by NL patent office.

(Continued)

*Primary Examiner* — Jayprakash N Gandhi
*Assistant Examiner* — Stephen S Sul
(74) *Attorney, Agent, or Firm* — Ladas & Parry, LLP

(57) ABSTRACT

An electronic module comprising a first electronic unit 51 which has a first insulating substrate 61 and a first electronic element 41 provided on the first insulating substrate 61 via a first conductor layer 21, a second electronic unit 52 which has a second insulating substrate 62 and a second electronic element 42 provided on the second insulating substrate 62 via a second conductor layer 22, a connecting body 29 provided between the first electronic unit 51 and the second electronic unit 52 and a coil 70 wound around the connecting body 29.

12 Claims, 11 Drawing Sheets

(51) Int. Cl.
  *H01L 23/498* (2006.01)
  *H03H 7/01* (2006.01)
  *H05K 7/20* (2006.01)
  *H01L 23/14* (2006.01)
  *H03H 1/00* (2006.01)
  *H01L 23/367* (2006.01)
  *H01L 49/02* (2006.01)
  *H01L 23/552* (2006.01)
  *H01L 23/00* (2006.01)
  *H01L 23/36* (2006.01)
  *H01L 25/07* (2006.01)
  *H05K 7/14* (2006.01)
  *H01L 23/373* (2006.01)
  *H02M 1/44* (2007.01)
  *H01L 23/522* (2006.01)
  *H01L 25/00* (2006.01)
  *H02M 7/00* (2006.01)
  *H01L 23/31* (2006.01)

(52) U.S. Cl.
  CPC ...... *H01L 23/3675* (2013.01); *H01L 23/3735* (2013.01); *H01L 23/49838* (2013.01); *H01L 23/5227* (2013.01); *H01L 23/552* (2013.01); *H01L 23/564* (2013.01); *H01L 25/00* (2013.01); *H01L 25/071* (2013.01); *H01L 25/072* (2013.01); *H01L 25/117* (2013.01); *H01L 28/10* (2013.01); *H02M 1/44* (2013.01); *H02M 7/003* (2013.01); *H03H 1/00* (2013.01); *H03H 7/0115* (2013.01); *H05K 7/1432* (2013.01); *H05K 7/209* (2013.01); *H01L 23/3107* (2013.01); *H01L 23/3121* (2013.01); *H03H 2001/005* (2013.01); *H03H 2001/0092* (2013.01)

(58) Field of Classification Search
  CPC . H01L 23/3107; H01L 23/3121; H01L 23/64; H01L 23/3735; H01L 23/5227; H01L 25/00; H01L 23/145; H01L 23/3675; H01L 23/49838; H01L 25/117; H01L 28/10; H05K 7/1432; H05K 7/209; H02M 1/44; H02M 7/003; H03H 2001/005; H03H 2001/0092; H03H 1/00; H03H 7/0115
  USPC .......... 361/707, 709, 712, 717–719
  See application file for complete search history.

(56) References Cited

U.S. PATENT DOCUMENTS

| | | | | |
|---|---|---|---|---|
| 2006/0114077 A1* | 6/2006 | Mizuno | H01L 21/84 | 333/33 |
| 2009/0086454 A1* | 4/2009 | Sakamoto | H05K 1/144 | 361/796 |
| 2010/0159719 A1* | 6/2010 | Kuwabara | H05K 1/144 | 439/66 |
| 2013/0016548 A1* | 1/2013 | Seki | H01L 24/32 | 363/131 |
| 2013/0088128 A1* | 4/2013 | Nakano | B62D 5/0406 | 310/68 R |
| 2014/0124915 A1* | 5/2014 | Hayashi | H01L 23/367 | 257/713 |
| 2014/0211439 A1 | 7/2014 | Gerber | | |
| 2015/0201495 A1 | 7/2015 | Kim et al. | | |
| 2016/0064312 A1* | 3/2016 | Bando | H01L 24/40 | 438/119 |
| 2016/0181175 A1* | 6/2016 | Ikeda | H01L 23/42 | 257/687 |
| 2017/0148770 A1 | 5/2017 | Ishino et al. | | |

FOREIGN PATENT DOCUMENTS

| | | | | |
|---|---|---|---|---|
| JP | 2007234888 A | 9/2007 | | |
| JP | 2014033125 A | 2/2014 | | |
| JP | 2015211524 A | 11/2015 | | |
| JP | 2016510513 A | 4/2016 | | |
| JP | 2017504211 A | 2/2017 | | |
| WO | WO-2014184846 A1 * | 11/2014 | ............ | H01L 24/92 |
| WO | 2015005181 A1 | 1/2015 | | |
| WO | 2016103783 A1 | 6/2016 | | |

OTHER PUBLICATIONS

International Search Report for PCT/JP2017/005147, dated Apr. 4, 2017, and its English translation provided by Google Translate.
International Preliminary Examination Report (Chapter II) for PCT/JP2017/005147, dated Aug. 8, 2017, and its English translation provided by Google Translate.
Written Opinion for PCT/JP2017/005147, dated Apr. 4, 2017, and its English translation provided by Google Translate.

* cited by examiner ic module in order to cool down electronic elements, etc., equipped in the electronic module (see, for example, JP 2015-211524A). When the heat dissipation layer is thus provided, a conductor layer, an insulating substrate, and the heat dissipation layer may act as a capacitor (a capacitor function may be formed). When the capacitor function is thus formed, noise caused by an electronic element in the electronic module may be emitted outside the electronic module through the heat dissipation layer.

ELECTRONIC MODULE

CROSS-REFERENCE TO RELATED APPLICATION

The present application is the U.S. national phase of PCT Application PCT/JP2017/005147 filed on Feb. 13, 2017, the disclosure of which is incorporated herein by reference in its entirety.

TECHNICAL FIELD

The present invention relates to an electronic module.

BACKGROUND ART

Conventionally, an electronic module such as a transfer power module is provided with a heat dissipation plate (heat dissipation layer) composed of copper, etc., on the back side of the electronic module in order to cool down electronic elements, etc., equipped in the electronic module (see, for example, JP 2015-211524A). When the heat dissipation layer is thus provided, a conductor layer, an insulating substrate, and the heat dissipation layer may act as a capacitor (a capacitor function may be formed). When the capacitor function is thus formed, noise caused by an electronic element in the electronic module may be emitted outside the electronic module through the heat dissipation layer.

SUMMARY OF INVENTION

Technical Problem

In view of such a problem, the present invention provides an electronic module capable of reducing noise.

Solution to Problem

An electronic module according to an aspect of the present invention may comprise:

a first electronic unit which has a first insulating substrate and a first electronic element provided on the first insulating substrate via a first conductor layer;

a second electronic unit which has a second insulating substrate and a second electronic element provided on the second insulating substrate via a second conductor layer;

a connecting body provided between the first electronic unit and the second electronic unit; and a coil wound around the connecting body.

In the electronic module according to an aspect of the present invention, the first electronic element or the second electronic element may have a switching element.

In the electronic module according to an aspect of the present invention, wherein the connecting body may have a cylindrical shape.

In the electronic module according to an aspect of the present invention, when the first electronic element has a switching element but the second electronic element does not have a switching element, a cooling body may be provided on a side of the second insulating substrate and may not be provided on a side of the first insulating substrate, when the second electronic element has a switching element but the first electronic element does not have a switching element, the cooling body may be provided on the side of the first insulating substrate and may not be provided on the side of the second insulating substrate.

The electronic module according to an aspect of the present invention may further comprise a resin substrate part which fixes the connecting body and the coil.

In the electronic module according to an aspect of the present invention, a control part, which controls the first electronic element or the second electronic element, may be provided in the resin substrate part.

In the electronic module according to an aspect of the present invention, wherein the connecting body having the coil wound therearound may be provided between the first insulating substrate and the second insulating substrate, and wherein the first electronic element and the second electronic element, and the coil may not be electrically connected.

In the electronic module according to an aspect of the present invention, wherein the connecting body having the coil wound therearound may be provided between the first electronic element or the first conductor layer and the second electronic element or the second conductor layer, and wherein the first electronic element and the second electronic element, and the coil may be electrically connected.

Advantageous Effects of Invention

In the present invention, the coil wound around the connecting body is equipped. Hence, the generation of noise caused by the electronic element can be suppressed.

DESCRIPTION OF EMBODIMENTS

Embodiment

<<Configuration>>

Figure 1:
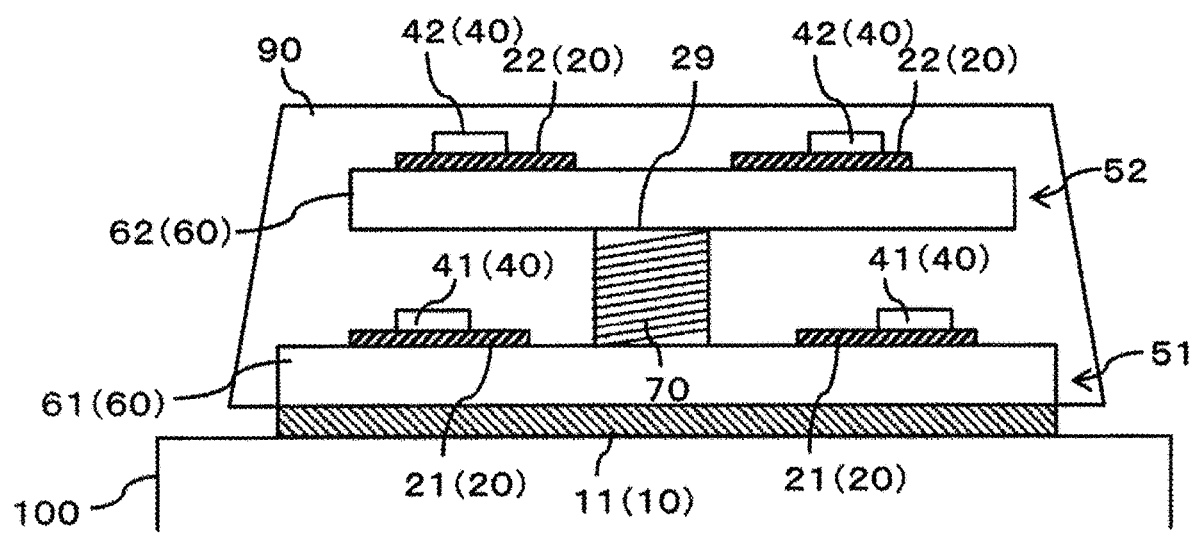
FIG. 1 is a vertical cross-sectional view of an electronic module of an embodiment of the present invention.

As shown in FIG. 1, an electronic module of the present embodiment has electronic elements 40 disposed so as to be stacked on top of each other, and has a stacked structure. More specifically, as shown in FIG. 1, the electronic module may have a first electronic unit 51, a second electronic unit 52, a connecting body 29 composed of a connecting pole or the like and provided between the first electronic unit 51 and the second electronic unit 52, and a coil 70 wound around the connecting body 29.

In the present embodiment, an example of the electronic module can include a semiconductor module, and an example of the electronic elements 40 can include semiconductor elements. However, the electronic module and the electronic elements 40 are not limited thereto and the "semiconductor" does not necessarily need to be used.

In addition, insulating substrates 60, conductor layers 20, and the electronic elements 40 may be covered with a sealing part 90 composed of a sealing resin, etc. As shown in FIG. 1, the back side of the sealing part 90 may have the same height position as the back side of an insulating substrate 60. Although FIG. 1 shows an aspect in which a heat dissipation layer 10 is provided on the back side of the insulating substrate 60 and the heat dissipation layer 10 protrudes from the back side of the sealing part 90, the configuration is not limited thereto, and the insulating substrate 60 may be buried in the sealing part 90 and the back side of the heat dissipation layer 10 may have the same height position as the back side of the sealing part 90. Note that the heat dissipation layer 10 may be provided on a cooling body 100 such as a heat sink.

The electronic elements 40 may include a switching element. Examples of the switching element can include a FET such as a MOSFET, a bipolar transistor, and an IGBT, and a typical example can include a MOSFET.

The first electronic unit 51 may have a first insulating substrate 61, first conductor layers 21 provided on one side (the upper side of FIG. 1) of the first insulating substrate 61, and first electronic elements 41 provided on one side of the first conductor layers 21. The second electronic unit 52 may have second conductor layers 22 and second electronic elements 42 provided on the second conductor layers 22. The second electronic unit 52 may have a second insulating substrate 62 provided on the other side (see FIG. 1, the lower side of FIG. 1) or one side (see FIG. 2, the upper side of FIG. 2) of the second electronic elements 42. In the second electronic unit 52, too, as with the first electronic unit 51, the second conductor layers 22 may be provided on the second insulating substrate 62 and the second electronic elements 42 may be provided on the second conductor layers 22. In an aspect shown in FIG. 1, the second electronic unit 52 has the second insulating substrate 62, the second conductor layers 22 provided on one side of the second insulating substrate 62, and the second electronic elements 42 provided on one side of the second conductor layers 22. In an aspect shown in FIG. 2, the second electronic unit 52 has the second insulating substrate 62, the second conductor layers 22 provided on the other side of the second insulating substrate 62, and the second electronic elements 42 provided on the other side of the second conductor layers 22.

Figure 2:
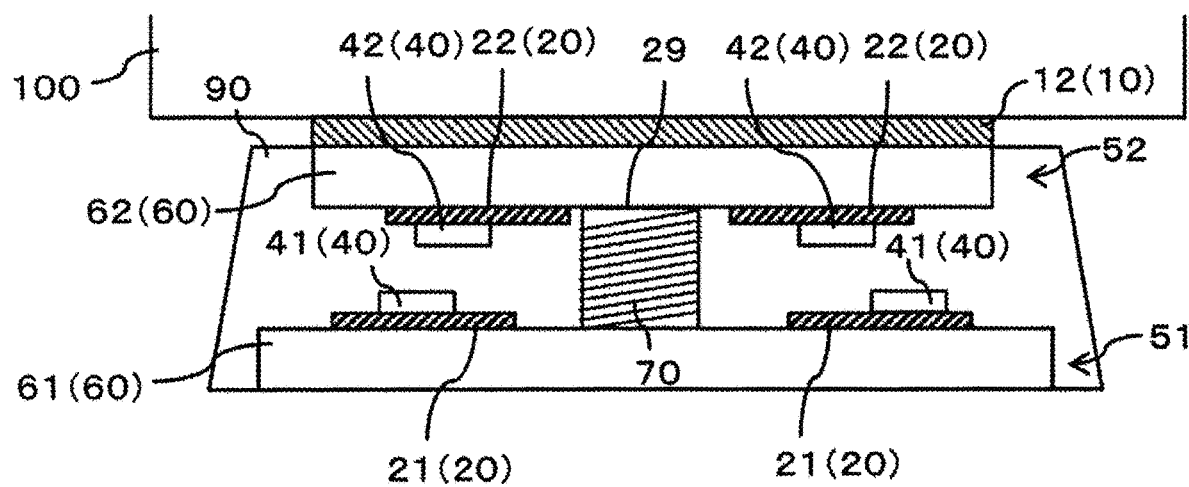
FIG. 2 is a vertical cross-sectional view of an electronic module of another aspect of the embodiment of the present invention.
Figure 3:
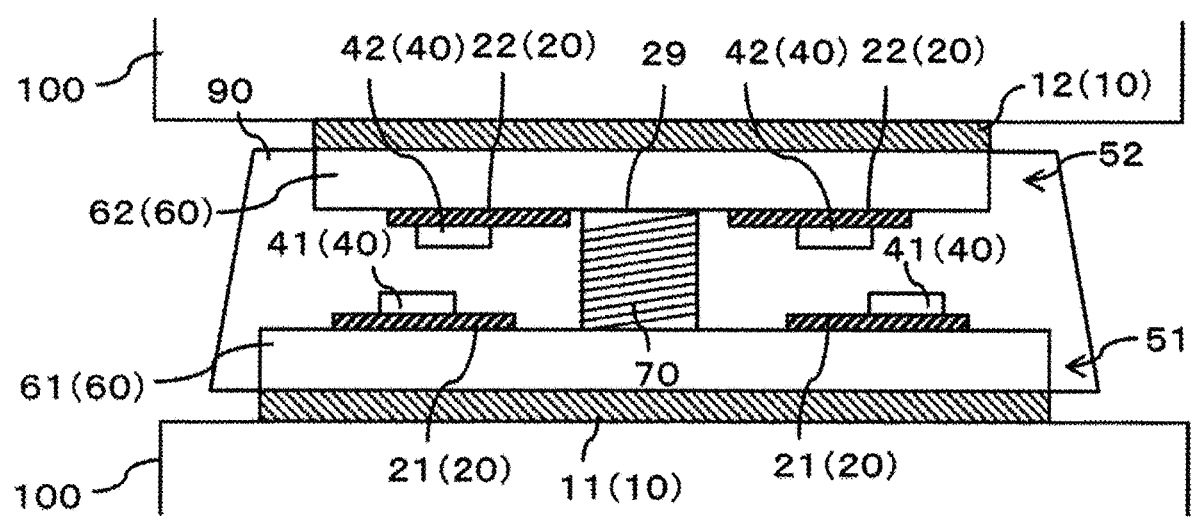
FIG. 3 is a vertical cross-sectional view of an electronic module of still another aspect of the embodiment of the present invention.

The first electronic unit 51 may have a first heat dissipation layer 11 provided on the other side (the lower side of FIG. 1) of the first insulating substrate 61. The second electronic unit 52 may have a second heat dissipation layer 12 provided on one side (the upper side of FIG. 2) of the second insulating substrate 62. In addition, as shown in FIG. 3, the first electronic unit 51 may have the first heat dissipation layer 11 provided on the other side (the lower side of FIG. 3) of the first insulating substrate 61, and the second electronic unit 52 may have the second heat dissipation layer 12 provided on one side (the upper side of FIG. 3) of the second insulating substrate 62.

The first electronic elements 41 and the second electronic elements 42 may have a switching element and/or a control element that controls the switching element. Alternatively, either one of the first electronic elements 41 and the second electronic elements 42 may have only a switching element and the other one of the first electronic elements 41 and the second electronic elements 42 may have only a control element.

When either one of the first electronic elements 41 and the second electronic elements 42 has a switching element and the other one of the first electronic elements 41 and the second electronic elements 42 does not have a switching element, a heat dissipation layer 10 may be provided for the other electronic element 40 and a cooling body 100 may come into contact with the heat dissipation layer 10; however, a heat dissipation layer 10 for the one electronic element 40 may not be provided and a cooling body may not be provided in a location where the one electronic element 40 is provided. For example, when the first electronic elements 41 do not have a switching element but the second electronic elements 42 have a switching element, the second heat dissipation layer 12 may not be provided but only the first heat dissipation layer 11 may be provided, and only the first heat dissipation layer 11 may abut on the cooling body 100 (see FIG. 1). When the first electronic elements 41 have a switching element but the second electronic elements 42 do not have a switching element, the first heat dissipation layer 11 may not be provided but only the second heat dissipation layer 12 may be provided, and only the second heat dissipation layer 12 may abut on the cooling body 100 (see FIG. 2). Note that in this aspect, the coil 70 may not be provided.

Figure 5:
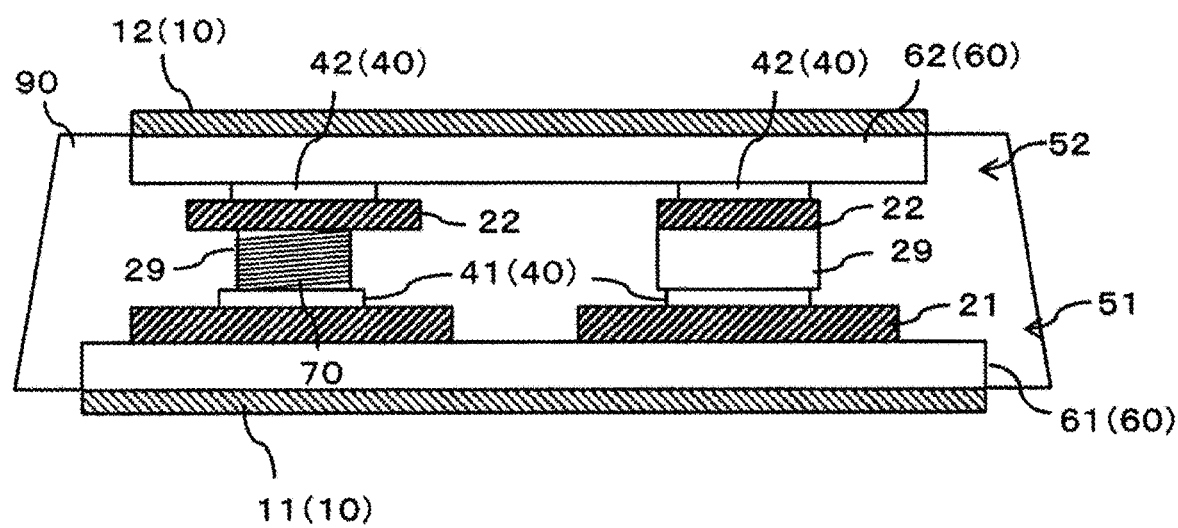
FIG. 5 is a vertical cross-sectional view for describing a variant (first variant) of an aspect that can be used in the embodiment of the present invention.
Figure 6:
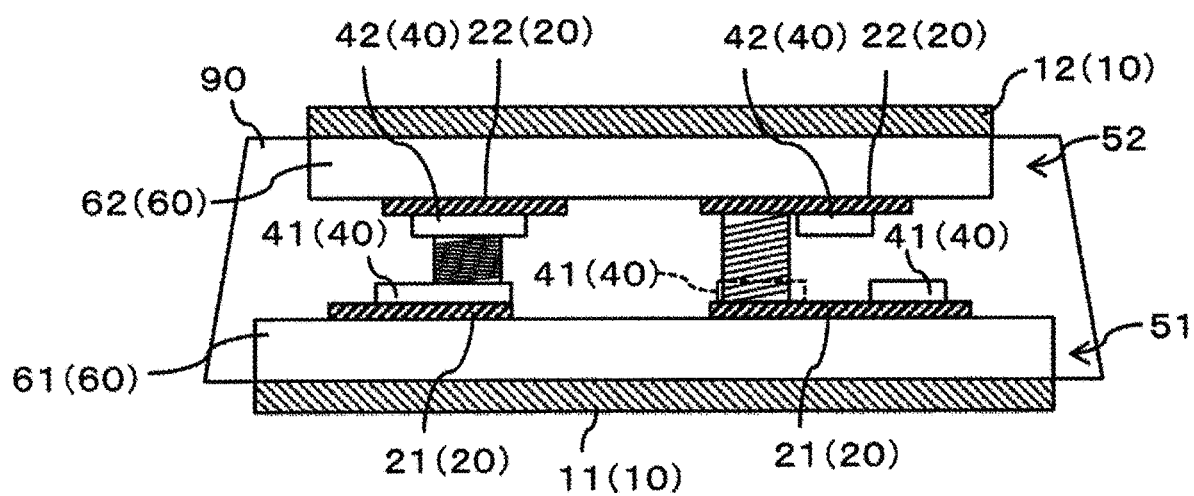
FIG. 6 is a vertical cross-sectional view for describing other variants (second and third variants) of an aspect that can be used in the embodiment of the present invention.
Figure 10:
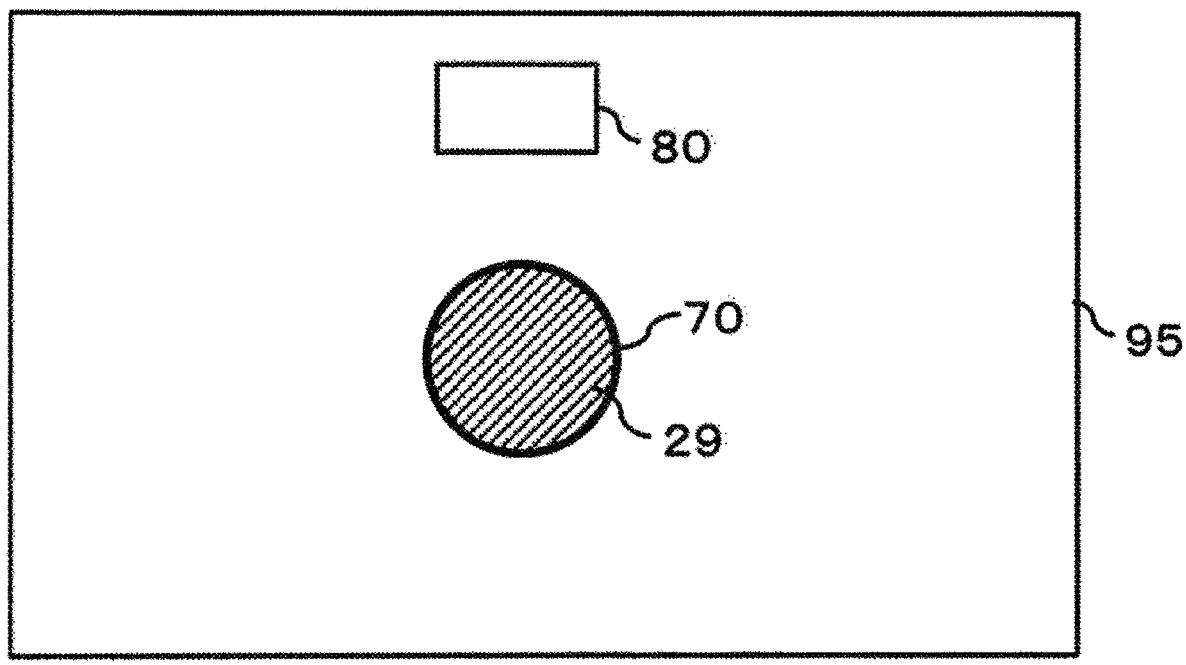
FIG. 10 is a plan view showing the resin substrate part that can be adopted in the embodiment of the present invention.

As shown in FIG. 10, the connecting body 29 may have a cylindrical shape. As shown in FIGS. 1 to 4, there may be one connecting body 29, or as shown in FIGS. 5 and 6, there may be a plurality of connecting bodies 29. In addition, a coil 70 may be wound around each of the plurality of connecting bodies 29, or a coil 70 may be wound around some of the plurality of connecting bodies 29. In an aspect shown in FIG. 5, a coil 70 is wound around a connecting body 29 on the left, but a coil 70 is not wound around a connecting body 29 on the right.

The first insulating substrate 61 may be provided with a plurality of first electronic elements 41. In addition, the second insulating substrate 62 may be provided with a plurality of second electronic elements 42. Each of the plurality of first electronic elements 41 and/or the plurality of second electronic elements 42 may be a switching element.

As shown in FIGS. 1 to 4, the connecting body 29 having the coil 70 wound therearound may be provided between the first insulating substrate 61 and the second insulating substrate 62. In this case, the first electronic elements 41 and the second electronic elements 42, and the coil 70 may be electrically connected through pseudocapacitors formed in the first insulating substrate 61 and through pseudocapacitors formed in the second insulating substrate 62. For example, as shown in FIG. 8, circuits including the coil 70 may be virtually disposed in parallel through pseudocapacitors (stray capacitances of the substrates) (see also FIG. 7). Note that the connecting body 29 may be provided so as to connect a central part in a plane direction of the first insulating substrate 61 to a central part in the plane direction of the second insulating substrate 62.

Figure 9:
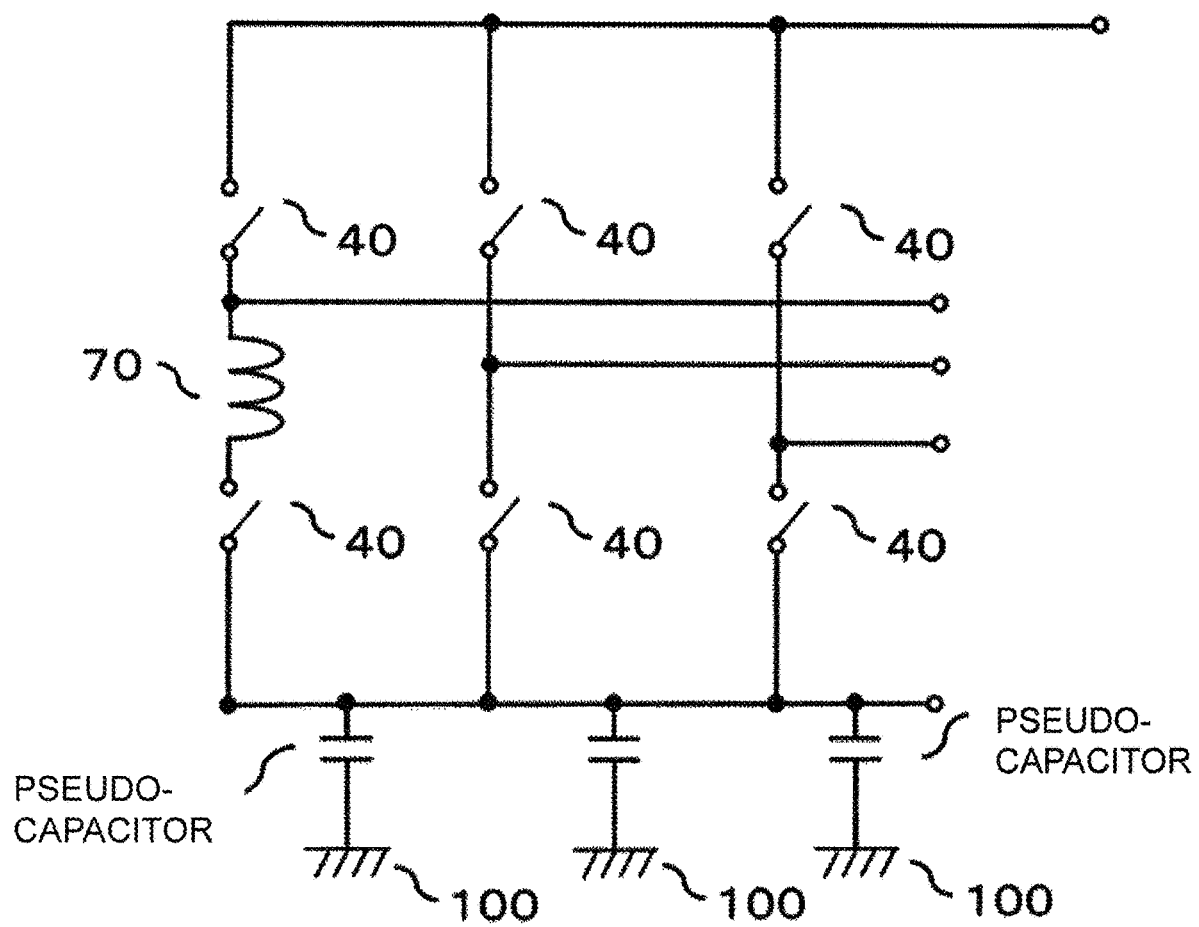
FIG. 9 is a circuit diagram showing pseudocapacitors that can be formed in the electronic module of the embodiment of the present invention in an aspect in which electronic elements and a coil are electrically connected.

The aspect is not limited to the above, and as shown in FIG. 9, a first electronic element 41 and/or a second electronic element 42 and a coil 70 may be electrically connected. FIG. 9 shows an aspect in which a coil 70 is provided between a single pair of electronic elements 40 (e.g., a first electronic element 41 and a second electronic element 42).

When a coil 70 is electrically connected to a first electronic element 41 and/or a second electronic element 42, a connecting body 29 having the coil 70 wound therearound may be provided between conductor layers 20. Specifically, as shown on the right side in FIG. 6, a connecting body 29 may be provided between a first conductor layer 21 and a second conductor layer 22, and a coil 70 may be wound around the connecting body 29.

When a coil 70 is electrically connected to a first electronic element 41 and/or a second electronic element 42, a connecting body 29 having the coil 70 wound therearound may be proved between an electronic element 40 and a conductor layer 20. Specifically, as shown on the left side in FIG. 5, a connecting body 29 may be provided between a first electronic element 41 and a second conductor layer 22, and a coil 70 may be wound around the connecting body 29. In addition, a connecting body 29 may be provided between a second electronic element 42 and a first conductor layer 21, and a coil 70 may be wound around the connecting body 29. Note that even in an aspect such as that shown in FIG. 6, a connecting body 29 having a coil 70 wound therearound may be provided between an electronic element 40 and a conductor layer 20 (see a first electronic element 41 indicated by a dashed line on the right side in FIG. 6).

When a coil 70 is electrically connected to a first electronic element 41 and/or a second electronic element 42, a connecting body 29 having the coil 70 wound therearound may be provided between electronic elements 40. Specifically, as shown on the left side in FIG. 6, a connecting body 29 may be provided between a first electronic element 41 and a second electronic element 42, and a coil 70 may be wound around the connecting body 29.

Figure 4:
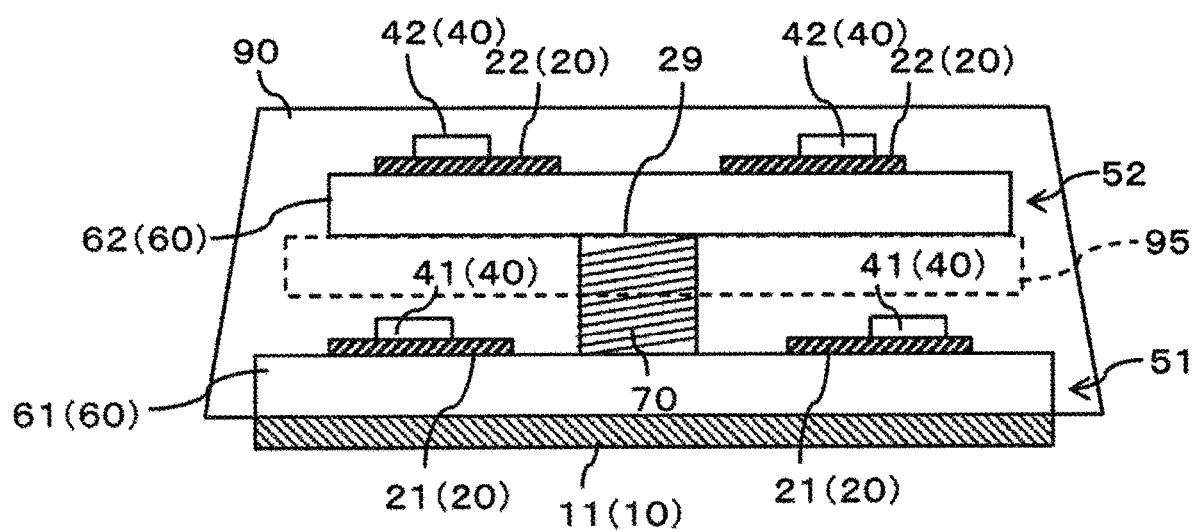
FIG. 4 is a vertical cross-sectional view of an electronic module of an aspect in which a resin substrate part is adopted in the embodiment of the present invention.

As shown in FIG. 4, a resin substrate part 95 that fixes a connecting body 29 and a coil 70 may be provided. The resin substrate part 95 may have the connecting body 29 and the coil 70 buried therein.

As shown in FIG. 10, the resin substrate part 95 may be provided with a control part 80 including an IC chip, a resistor, a capacitor, etc. The control part 80 may have a function of controlling the first electronic elements 41 and/or the second electronic elements 42 which are composed of a switching element.

The sealing part 90 and the resin substrate part 95 may be formed of different resin materials. As an example, the sealing part 90 may be composed of a thermosetting resin and the resin substrate part 95 may be composed of a thermoplastic resin.

The thermoplastic resin is not particularly limited, but plastics, etc., can be used. Examples of the thermoplastic resin can include polyethylenes, polypropylenes, poly-4-methylpentene-1, ionomers, polystyrenes, AS resins, ABS resins, polyvinyl chlorides, polyvinylidene chlorides, methacrylic resins, polyvinyl alcohols, EVAs, polycarbonates, various kinds of nylons, various kinds of aromatic or aliphatic polyesters, thermoplastic polyurethanes, cellulose-based plastics, thermoplastic elastomers, polyarylate resins, polyethylene terephthalates, polybutylene terephthalates, polyimides, polyamideimides, polyetherimides, polysulfones, polyether sulfones, polyphenylene sulfides, polyphenylethers, polybenzimidazoles, aramids, and poly(p-phenylenebenzobisoxazole).

The thermosetting resin is not particularly limited, but examples thereof can include epoxy resins, phenol resins, and unsaturated polyester resins.

<<Functions and Effects>>

Next, functions and effects that are bought about by the present embodiment including the above-described configurations and that have not been described yet will be described. Various configurations described in the "Functions and Effects" can also be adopted.

In the present embodiment, the coil 70 wound around the connecting body 29 is equipped. Hence, the generation of noise caused by the electronic elements 40 can be suppressed.

Particularly, when the electronic elements 40 have a switching element, noise generated from the switching element is emitted outside the electronic module through a capacitor which is formed in a pseudo manner by a heat dissipation layer 10, a conductor layer 20, an insulating substrate 60, etc. (see FIG. 7). In the present embodiment, by providing the coil 70 to the connecting body 29, the generation of noise can be suppressed. Note that in this specification the terms "electronic elements 40", "first electronic elements 41", and "second electronic elements 42" collectively refer to a single or a plurality of electronic elements 40. Hence, for example, the expression "the electronic elements 40 have a switching element" refers to that at least one of the electronic elements 40 is a switching element. The same also applies to the first electronic elements 41 and the second electronic elements 42.

Figure 7:
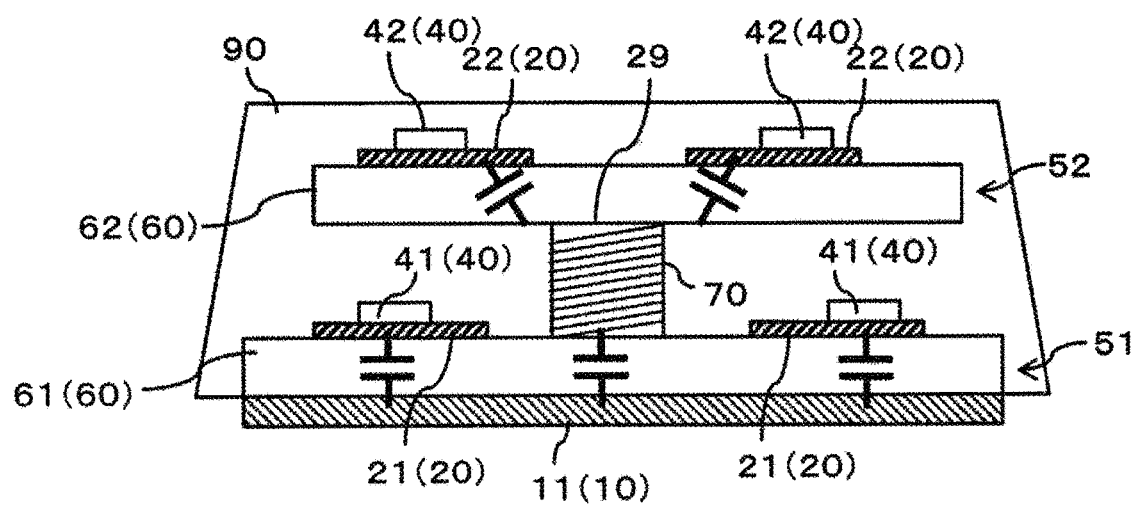
FIG. 7 is a vertical cross-sectional view showing pseudo-capacitors that can be formed in the electronic module of the embodiment of the present invention.
Figure 8:
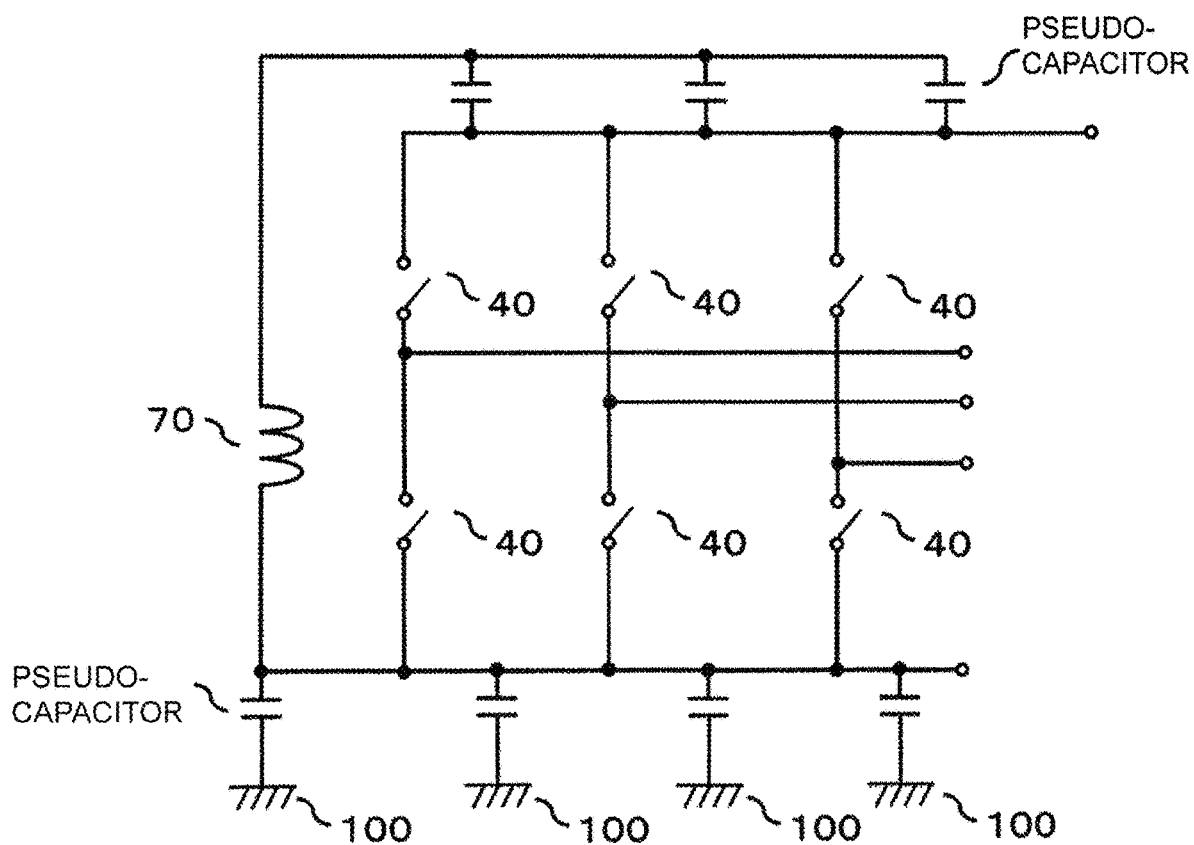
FIG. 8 is a circuit diagram showing pseudocapacitors that can be formed in the electronic module of the embodiment of the present invention in an aspect in which electronic elements and a coil are electrically connected through pseudocapacitors formed in the insulating substrates.

In addition, as shown in FIG. 7, capacitors may be formed in a pseudo manner in the insulating substrates 60 provided in the sealing part 90, too, but by providing the coil 70 to the connecting body 29, the emission of noise outside the electronic module by such capacitors formed in a pseudo manner can be reduced (see FIG. 8).

When an aspect is adopted in which, when either one of the first electronic elements 41 and the second electronic elements 42 has a switching element and the other does not have a switching element, a heat dissipation layer 10 that abuts on a cooling body 100 is provided only for the other electronic element 40, but a heat dissipation layer 10 for the one electronic element 40 is not provided, the emission of noise outside the electronic module can be reduced. More specifically, when the first electronic elements 41 do not have a switching element but the second electronic elements 42 have a switching element, an aspect is adopted in which, as shown in FIG. 1, the first heat dissipation layer 11 is provided but the second heat dissipation layer 12 is not provided, and an aspect is adopted in which only the first heat dissipation layer 11 abuts on the cooling body 100. By this, the formation of a pseudo capacitor between the side of the second electronic elements 42 having a switching element and the cooling body 100 can be prevented (see FIG. 7). Hence, the emission of noise outside the electronic module can be reduced. In addition, when the first electronic elements 41 have a switching element but the second electronic elements 42 do not have a switching element, an aspect is adopted in which, as shown in FIG. 2, the second heat dissipation layer 12 is provided but the first heat dissipation layer 11 is not provided, and an aspect is adopted in which only the second heat dissipation layer 12 abuts on the cooling body 100. By this, the formation of a pseudo capacitor between the side of the first electronic elements 41 having a switching element and the cooling body 100 can be prevented. Hence, the emission of noise outside the electronic module can be reduced.

As shown in FIG. 10, by forming the connecting body 29 in a cylindrical shape, the coil 70 can be easily wound. Thus, a manufacturing process is facilitated, which in turn can be expected to reduce manufacturing cost.

When an aspect in which the resin substrate part 95 fixes the connecting body 29 and the coil 70, more specifically, the connecting body 29 and the coil 70 are buried in the resin substrate part 95, is adopted (see FIG. 10), an electronic module can be manufactured with the connecting body 29 and the coil 70 being positioned in advance. In terms of this, a manufacturing process is facilitated, which in turn can be expected to reduce manufacturing cost.

When an aspect is adopted in which, as shown in FIGS. 1 to 4, the connecting body 29 having the coil 70 wound therearound is provided between the first insulating substrate 61 and the second insulating substrate 62, it is beneficial in terms of that noise caused by the first electronic elements 41 provided on the first insulating substrate 61's side and the second electronic elements 42 provided on the second insulating substrate 62's side can be reduced by the coil 70.

When an aspect in which, as shown on the right side in FIG. 6, the connecting body 29 having the coil 70 wound therearound is provided between the conductor layers 20 is adopted, more specifically, when an aspect in which the connecting body 29 having the coil 70 wound therearound is provided between the first conductor layer 21 and the second conductor layer 22 is adopted, it is beneficial in terms of that noise generated from the first electronic element 41 and the second electronic element 42 which are close can be reduced by the coil 70.

In this aspect, the connecting body 29 having the coil 70 wound therearound may be provided for switching elements. In this case, it is beneficial in terms of that the effect of reducing noise caused by the switching elements can be enhanced. More specifically, a conductor layer 20 provided with a switching element and a conductor layer 20 provided with a switching element may be connected by a connecting body 29 having a coil 70 wound therearound. In addition, a conductor layer 20 provided with a switching element and a conductor layer 20 provided with an electronic element 40 which is not a switching element (e.g., a control element) may be connected by a connecting body 29 having a coil 70 wound therearound. Particularly, when an aspect is adopted in which a conductor layer 20 provided with a switching element and a conductor layer 20 provided with a switching element are connected by a connecting body 29 having a coil 70 wound therearound, it is beneficial in terms of that noise can be reduced more directly by the coil 70.

When an aspect is adopted in which, as shown on the left side in FIG. 5, the connecting body 29 having the coil 70 wound therearound is provided between the electronic element 40 and the conductor layer 20, more specifically, when an aspect is adopted in which the connecting body 29 having the coil 70 wound therearound is provided between the first electronic element 41 and the second conductor layer 22 and/or the connecting body 29 having the coil 70 wound therearound is provided between the second electronic element 42 and the first conductor layer 21, it is beneficial in terms of that noise generated from the first electronic element 41 and the second electronic element 42 which are close can be reduced by the coil 70.

In this aspect, the connecting body 29 having the coil 70 wound therearound may be provided for switching elements. In this case, it is beneficial in terms of that the effect of reducing noise caused by the switching elements can be enhanced. More specifically, a switching element and a conductor layer 20 provided with a switching element may be connected by a connecting body 29 having a coil 70 wound therearound. In addition, a switching element and a conductor layer 20 provided with an electronic element 40 which is not a switching element (e.g., a control element) may be connected by a connecting body 29 having a coil 70 wound therearound. Particularly, when an aspect is adopted in which a switching element and a conductor layer 20 provided with a switching element are connected by a connecting body 29 having a coil 70 wound therearound, it is beneficial in terms of that noise can be reduced more directly by the coil 70.

When an aspect is adopted in which, as shown on the left side in FIG. 6, the connecting body 29 having the coil 70 wound therearound is provided between the electronic elements 40, more specifically, when an aspect is adopted in which the connecting body 29 having the coil 70 wound therearound is provided between the first electronic element 41 and the second electronic element 42, it is beneficial in terms of that noise generated from the first electronic element 41 and the second electronic element 42 which are close can be reduced by the coil 70.

In this aspect, the connecting body 29 having the coil 70 wound therearound may be provided for switching elements. In this case, it is beneficial in terms of that the effect of reducing noise caused by the switching elements can be enhanced. More specifically, a switching element and a switching element may be connected by a connecting body 29 having a coil 70 wound therearound. In addition, a switching element and an electronic element 40 which is not a switching element (e.g., a control element) may be connected by a connecting body 29 having a coil 70 wound therearound. Particularly, when an aspect is adopted in which a switching element and a switching element are connected by a connecting body 29 having a coil 70 wound therearound, it is beneficial in terms of that noise can be reduced more directly by the coil 70.

Note that noise may be able to be reduced more directly directly by a coil 70 when an aspect is adopted in which a conductor layer 20 and an electronic element 40 are connected through a connecting body 29 having a coil 70 wound therearound, compared to when a connecting body 29 having a coil 70 wound therearound is provided with conductor layers 20 sandwiching the connecting body 29. In addition, noise may be able to be reduced more directly by a coil 70 when an aspect is adopted in which electronic elements 40 are directly connected by a connecting body 29 having a coil 70 wound therearound, compared to an aspect in which a conductor layer 20 and an electronic element 40 are connected through a connecting body 29 having a coil 70 wound therearound.

When an aspect in which, as shown in FIG. 10, the control part 80 is provided in the resin substrate part 95 is adopted, since electronic elements 40 and the control part 80 can be positioned very close, the possibility of malfunction can be reduced in advance. In addition, by thus providing the control part 80 in the electronic module, an intelligent power module (IPM) can be implemented.

When an aspect in which the sealing part 90 and the resin substrate part 95 are formed of different resin materials is adopted, it is beneficial in terms of that the resin substrate part 95 located on the inner side and the sealing part 90 located on the outer side can function differently. For example, even if the sealing part 90 is of a thermosetting resin, when a thermoplastic resin is adopted as a material for the resin substrate part 95, high positioning accuracy can be expected. That is, when a thermosetting resin is used for the resin substrate part 95, since hardness is not sufficient before the application of heat, there is a possibility that the positions of the coil 70, the connecting body 29, the control part 80, etc., may be shifted from their expected positions. In this regard, when a thermoplastic resin is adopted for the resin substrate part 95, since hardness is sufficient before the application of heat, the possibility of a shift in the positions of the coil 70, the connecting body 29, the control part 80, etc., can be reduced.

Figure 11:
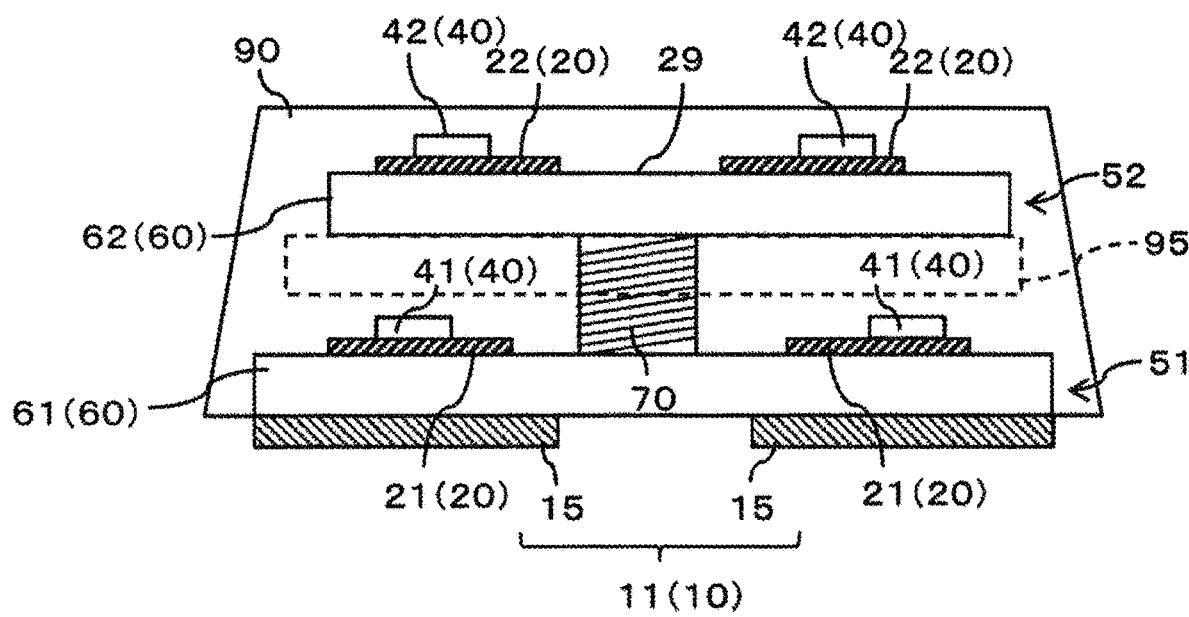
FIG. 11 is a vertical cross-sectional view of an electronic module of an aspect in which heat dissipation layer patterns are adopted in the embodiment of the present invention.

An aspect can also be adopted in which, as shown in FIG. 11, a heat dissipation layer 10 has a plurality of heat dissipation layer patterns 15 into which the heat dissipation layer 10 is divided in a plane direction. By adopting such heat dissipation layer patterns 15, the area in an in-plane direction of the heat dissipation layer 10 can be reduced, and thus, the capacitances of capacitor functions (the capacitances of capacitors) formed by a cooling body 100, the heat dissipation layer 10, conductor layers 20, an insulating substrate 60, etc., can be reduced. As a result, noise to be emitted can be suppressed. Note that the capacitance C of a parallel-plate capacitor is represented by $C=\varepsilon S/d$ (here, "S" is the area of parallel plates, "d" is the distance between the parallel plates, and "$\varepsilon$" is the permittivity of an insulator present between the parallel plates), and "S" can be reduced by adopting a plurality of heat dissipation layer patterns 15. In addition, although FIG. 11 shows an aspect in which a first heat dissipation layer 11 has the heat dissipation layer patterns 15, the configuration is not limited thereto, and instead of the first heat dissipation layer 11 or in addition to the first heat dissipation layer 11, a second heat dissipation layer 12 may have heat dissipation layer patterns.

The above-described description of the embodiments, description of the variants, and disclosure of the drawings are merely an example for describing the inventions recited in the claims, and the inventions recited in the claims are not limited by the above-described description of the embodiments, description of the variants, and disclosure of the drawings. In addition, a claim recitation made at the time of filing of this application is merely an example, and the claim recitation can also be changed as appropriate based on the description of the specification, drawings, etc.

REFERENCE SIGNS LIST

10 HEAT DISSIPATION LAYER
15 HEAT DISSIPATION LAYER PATTERN
20 CONDUCTOR LAYER
29 CONNECTING BODY
40 ELECTRONIC ELEMENT
41 FIRST ELECTRONIC ELEMENT
42 SECOND ELECTRONIC ELEMENT
51 FIRST ELECTRONIC UNIT
52 SECOND ELECTRONIC UNIT
60 INSULATING SUBSTRATE
61 FIRST INSULATING SUBSTRATE
62 SECOND INSULATING SUBSTRATE
70 COIL
95 RESIN SUBSTRATE PART

The invention claimed is:

1. An electronic module comprising:
a first electronic unit which has a first insulating substrate and a first electronic element provided on the first insulating substrate via a first conductor layer;
a second electronic unit which has a second insulating substrate and a second electronic element provided on the second insulating substrate via a second conductor layer;
a connecting body provided between the first electronic unit and the second electronic unit; and
a coil wound around the connecting body,
wherein the connecting body having the coil wound therearound is provided between the first insulating substrate and the second insulating substrate, and
wherein the first electronic element and the coil are electrically connected through pseudocapacitors in the first insulating substrate, and the second electronic element and the coil are electrically connected through pseudocapacitors in the second insulating substrate.

2. The electronic module according to claim 1,
wherein the first electronic element or the second electronic element has a switching element.

3. The electronic module according to claim 2,
wherein the connecting body has a cylindrical shape.

4. The electronic module according to claim 2,
wherein when the first electronic element has a switching element but the second electronic element does not have a switching element, a cooling body is provided on a side of the second insulating substrate and is not provided on a side of the first insulating substrate, or
wherein when the second electronic element has a switching element but the first electronic element does not have a switching element, the cooling body is provided on the side of the first insulating substrate and is not provided on the side of the second insulating substrate.

5. The electronic module, according to claim 2, further comprising a resin substrate part which fixes the connecting body and the coil.

6. The electronic module according to claim 1,
wherein the connecting body has a cylindrical shape.

7. The electronic module according to claim 6,
wherein when the first electronic element has a switching element but the second electronic element does not have a switching element, a cooling body is provided on a side of the second insulating substrate and is not provided on a side of the first insulating substrate, or
wherein when the second electronic element has a switching element but the first electronic element does not have a switching element, the cooling body is provided on the side of the first insulating substrate and is not provided on the side of the second insulating substrate.

8. The electronic module, according to claim 6, further comprising a resin substrate part which fixes the connecting body and the coil.

9. The electronic module according to claim 1,
wherein when the first electronic element has a switching element but the second electronic element does not have a switching element, a cooling body is provided on a side of the second insulating substrate and is not provided on a side of the first insulating substrate, or
wherein when the second electronic element has a switching element but the first electronic element does not have a switching element, the cooling body is provided on the side of the first insulating substrate and is not provided on the side of the second insulating substrate.

10. The electronic module, according to claim 9, further comprising a resin substrate part which fixes the connecting body and the coil.

11. The electronic module, according to claim 1, further comprising a resin substrate part which fixes the connecting body and the coil.

12. The electronic module according to claim 11, wherein a control part, which controls the first electronic element or the second electronic element, is provided in the resin substrate part.

* * * * *